United States Patent
Fallah et al.

(10) Patent No.: US 7,834,684 B2
(45) Date of Patent: Nov. 16, 2010

(54) SIZING AND PLACEMENT OF CHARGE RECYCLING (CR) TRANSISTORS IN MULTITHRESHOLD COMPLEMENTARY METAL-OXIDE-SEMICONDUCTOR (MTCMOS) CIRCUITS

(75) Inventors: Farzan Fallah, San Jose, CA (US); Ehsan Pakbaznia, Los Angeles, CA (US); Massoud Pedram, Beverly Hills, CA (US)

(73) Assignee: Fujitsu Limited, Kawasaki (JP)

( * ) Notice: Subject to any disclaimer, the term of this patent is extended or adjusted under 35 U.S.C. 154(b) by 201 days.

(21) Appl. No.: 12/263,312

(22) Filed: Oct. 31, 2008

(65) Prior Publication Data

US 2009/0174469 A1 Jul. 9, 2009

Related U.S. Application Data

(60) Provisional application No. 61/012,837, filed on Dec. 11, 2007.

(51) Int. Cl.
*G05F 1/10* (2006.01)
(52) U.S. Cl. ....................................... 327/544
(58) Field of Classification Search .......... 326/31, 326/33, 34; 327/544, 545, 546
See application file for complete search history.

(56) References Cited

U.S. PATENT DOCUMENTS

| | | | |
|---|---|---|---|
| 7,400,175 B2* | 7/2008 | Fallah et al. ............ | 326/93 |
| 7,486,108 B2* | 2/2009 | Kim et al. ............... | 326/34 |
| 7,616,051 B2* | 11/2009 | Veendrick et al. ....... | 327/544 |
| 7,649,406 B2* | 1/2010 | Parris et al. ............ | 327/544 |

OTHER PUBLICATIONS

Agarwal et al., Power gating with multiple sleep modes, in Proc. Int. Symp. Quality Electron. Des. pp. 633-637, 2006.

Davoodi et al., Wake-up protocols for controlling current surges in MTCMOS-based technology, in Proc. Asia South Pacific Des. Autom. Conf., pp. 868-871, 2005.

Heydari et al., Ground bounce in digital VLSI circuits, IEEE Trans. Very Large Scale Integr. (VLSI) Syst., vol. 11, No. 2, pp. 180-193, Apr. 2003.

Long et al., Distributed sleep transistor network for power reduction, IEEE Trans. Very Large Scale Integr. (VLSI) Syst., vol. 12, No. 9, pp. 937-946, Sep. 2004.

Pakbaznia et al., Course-grain MTCMOS sleep transistor sizing using delay budgeting, Proc. Des. Autom. Test Eur., pp. 385-390, Mar. 2008.

(Continued)

*Primary Examiner*—Jeffrey S Zweizig
(74) *Attorney, Agent, or Firm*—Baker Botts L.L.P.

(57) ABSTRACT

In one embodiment, a circuit includes a first row of circuit blocks that are each connected to a supply directly and to ground via a first sleep transistor. A connection between the first circuit block and the first sleep transistor is a virtual ground node. The circuit includes a second row of circuit blocks that are each connected to ground directly and to the supply via a second sleep transistor. A connection between the second circuit block and the second sleep transistor is a virtual supply node. The circuit includes a transmission gate (TG) or pass transistor connecting the virtual ground nodes to the virtual supply nodes to enable charge recycling between circuit blocks in the first row and circuit blocks in the second row during transitions by the circuit from active mode to sleep mode, from sleep mode to active mode, or both.

24 Claims, 4 Drawing Sheets

OTHER PUBLICATIONS

U.S. Appl. No. 12/263,341, filed Oct. 31, 2008, Fallah et al.

Abdollohi, A. et al., "An effective power mode transition technique in MTCMOS circuits," in Proc. Design Automation Conference, pp. 37-42, 2005.

Anis, M. et al., "Dynamic and leakage power reduction in MTCMOS circuits using an automated efficient gate clustering technique," Proc. Design Automation Conference, pp. 480-485, 2002.

Anis, M. et al., "Design and Optimization of Multithreshold CMOS (MTCMOS) Circuits," IEEE Transactions on CAD of Integrated Circuits and Systems, 2003.

Elmore, W.C. et al., "The Transient Response of Damped Linear Network with Particular Regard to Wideband Amplifier," J. Appl. Phys., vol. 19, No. 1, pp. 55-63, 1948.

Heydari, P. et al., Ground bounce in digital VLSI circuits, IEEE Trans. on VLSI systems, pp. 180-193, 2003.

Kahng, A.B. et al., "Improved effective capacitance computations for use in logic and layout optimization," Proc. of VLSI Design, pp. 578-582, 1999.

Kao, J. et al., "Subthreshold leakage modeling and reduction techniques," in Proc. Int'l. Conf. on Computer-Aided Design, pp. 141-148, 2002.

Kao, J. et al., "Transistor Sizing Issues and Tool for Multi Threshold CMOS Technology," in Proc. Design Automation Conference, pp. 409-414, 1997.

Kao, S. et al., "MTCMOS hierarchical sizing based on mutual exclusive discharge patterns," in Proc. Design Automation Conference, pp. 495-500, 1998.

Kawaguchi, H. et al., "A Super Cut-Off CMOS (SCCMOS) Scheme for 0.5-V Supply Voltage with Picoampere Stand-By Current," IEEE Journal of Solid-State Circuits, vol. 35, No. 10, pp. 1498-1501, 2000.

Khandelwal, V. et al., "Leakage Control through Fine-Grained Placement and Sizing of Sleep Transistors", Proc. Int'l Conference on Computer Aided Design, pp. 533-536, 2004.

Kim, S. et al., "Experimental measurement of a novel power gating structure with intermediate power saving mode," Proc. Int'l Symp. on Low Power Electronics and Design, pp. 20-25, 2004.

Kim, S. et al., "Understanding and minimizing ground bounce during mode transition of power gating structures," Proc. Int'l. Symp. on Low Power Electronics and Design, pp. 22-25, 2003.

Min, K.S. et al., "Zigzag Super Cut-off CMOS (ZSCCMOS) Scheme with Self-Saturated Virtual Power Lines for Subthreshold-Leakage-Suppressed Sub-1-V-$V_{DD}$ LSI's," Proc. European Sold-State Circuits Conference, pp. 679-682, 2002.

Mukhopadhyay, S. et al., "Modeling and Estimation of Total Leakage Current in Nano-scaled CMOS Devices Considering the Effect of Parameter Variation," Proc. Int'l. Symp. on Low Power Electronics and Design, pp. 172-175, 2003.

Mutoh, S. ct al., "1-V power supply high-speed digital circuit tcchnology with multi thrcshold-voltage CMOS," IEEEJSSC, vol. 30, pp. 847-854, 1995.

O'Brien, P.R. et al., "Modeling the Driving-Point Characteristics of Resistive Interconnect for Accurate Delay Estimation," Proc. of IEEE int'l Conf. on Computer Aided Design, pp. 512-515, 1989.

Pakbaznia et al., Charge Recycling in Power-Gated CMOS Circuits, Submitted to IEEE Transactions on Computer-Aided Design of Integrated Circuits and Systems, University of Southern California, Los Angeles, Fujitsu Laboratories of America, Sunnyvale, California, pp. 1-12, Oct. 2008.

Pakbaznia ct al., Sizing and Placcment of Charge Rccycling Transistors in MTCMOS Circuits, 1-4244-1382-6/07, IEEE, pp. 791-796, Nov. 2007.

Pakbaznia, E. et al., "Charge recyclying in MTCMOS circuits: concept and analysis," in Proc. Design Automation Conference, pp. 97-102, 2006.

Ramalingam, A. et al., "Sleep transistor sizing using timing criticality and temporal currents," in Proc. Asia South Pacific Design Automation Conference, pp. 1094-1097, 2005.

* cited by examiner

SIZING AND PLACEMENT OF CHARGE RECYCLING (CR) TRANSISTORS IN MULTITHRESHOLD COMPLEMENTARY METAL-OXIDE-SEMICONDUCTOR (MTCMOS) CIRCUITS

RELATED APPLICATION

This Application claims the benefit, under 35 U.S.C. §119 (e), of Provisional Patent Application No. 61/012,837, filed 11 Dec. 2007, which is incorporated herein by reference.

TECHNICAL FIELD

This disclosure relates generally to circuit design.

BACKGROUND

A downside of multithreshold complementary metal-oxide-semiconductor (MTCMOS) techniques for reducing leakage is energy consumption during transitions between sleep and active modes. A charge recycling (CR) MTCMOS architecture may reduce energy consumption during mode transition in power-gated circuits.

DESCRIPTION OF EXAMPLE EMBODIMENTS

Figure 1:
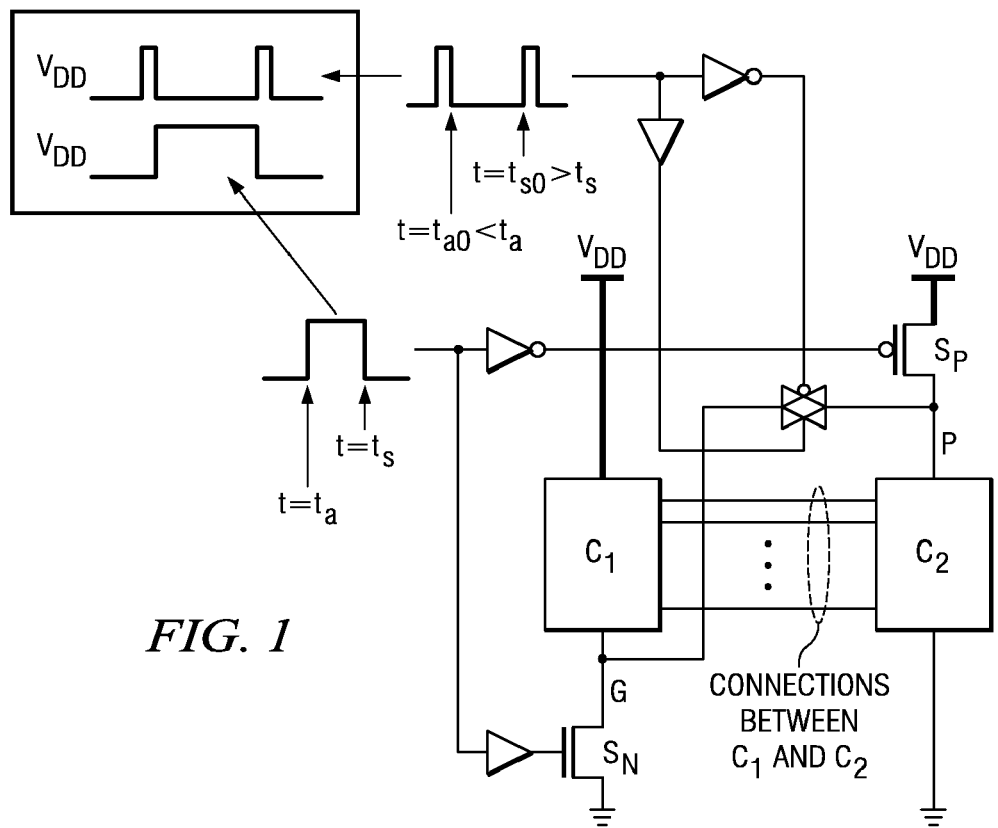
FIG. 1 illustrates an example CR configuration in an example power-gating structure.

As discussed above, a downside of MTCMOS techniques for reducing leakage is energy consumption during transitions between sleep and active modes. A CR MTCMOS architecture may reduce energy consumption during mode transition in power-gated circuits. In particular embodiments, because of RC parasitics associated with virtual ground and $V_{DD}$ lines, proper sizing and placement of CR transistors facilitates desired power saving. Particular embodiments formulate sizing and placement of CR transistors in a CR MTCMOS circuit as a linear programming (LP) problem. Particular embodiments use standard mathematical programming packages to solve sizing and placement of CR transistors in CR MTCMOS circuits. Particular embodiments more efficiently solve sizing and placement of CR transistors in CR MTCMOS circuits. Particular embodiments facilitate the use of CR MTCMOS in large row-based standard cell layouts, while nearly achieving the full potential of the power-gating architecture. Particular embodiments reduce energy consumption due to mode transition in CR MTCMOS circuits.

Reducing threshold voltages of transistors in submicron complementary metal-oxide-semiconductor (CMOS) technology may compensate for performance degradation caused by decreased supply voltage, but reducing threshold voltage may exponentially increase subthreshold leakage current. To provide low leakage and high performance, power-gating techniques may use transistors having low threshold voltages for logic cells and devices having high threshold voltages as sleep transistors to disconnect logic cells from power supply, ground, or both. Such techniques may reduce leakage in sleep mode. We may define wakeup time latency in a circuit as the time required to turn on the circuit after receipt of a wakeup signal. Wakeup time latency is a concern in MTCMOS technology. Reducing wakeup time latency may affect overall performance of a very large-scale integration (VLSI) circuit. Reducing energy waste during mode transition (e.g. switching from active to sleep mode or vice versa) is an important issue concerning power gating. Both virtual ground and virtual $V_{DD}$ nodes may experience voltage change during mode transition. Since a relatively large number of cells typically connect to virtual ground and virtual supply nodes, total switching capacitance at these nodes is usually large and power consumption during mode transition significant.

Sleep transistor sizing is an important issue concerning the design of MTCMOS circuits. There are techniques for sizing one or more sleep transistors to enable an arbitrary circuit to meet a performance constraint, but these techniques typically provide little or no reduction in power consumption during sleep-to-active or active-to-sleep mode transition. In contrast, CR reduces energy consumption during mode transition in MTCMOS circuits. Particular embodiments apply CR between consecutive rows of a standard cell design. In particular embodiments, one or more algorithms determine placement and sizing for CR transistors.

FIG. 1 illustrates an example CR configuration in an example power-gating structure. By way of example and not by way of limitation, the CR transmission gate may turn on before going from sleep to active and after going from active to sleep. During active mode, voltage values for nodes G and P may be close to 0 and $V_{DD}$, respectively. In sleep mode, voltage values for nodes G and P may be close to $V_{DD}$ and 0, respectively. CR may reduce this mode transition switching energy consumption. At the sleep-to-active transition edge and before the sleep transistors turn on, the CR circuitry may turn on, which may put the circuit into a half-wakeup state. After CR finishes, the CR circuitry may turn off and the sleep transistors may turn on to wake up the circuit. A similar strategy may be used at the active-sleep transition edge. After the sleep transistors turn off, the CR circuitry may turn on to help charge the virtual ground nodes and discharge the virtual supply nodes. We may assume that node G charges to $V_{DD}$ in sleep mode. For example, consider subcircuit $C_1$ in FIG. 1. The assumption that node G charges to $V_{DD}$ in sleep mode is invalid only when the outputs of all logic cells in $C_1$ are set to logic 1 (e.g. when the pull-down sections of these cells are off) before the active-to-sleep transition occurs. However, this rarely occurs in practice: if at least one cell in $C_1$ has an output value set to logic 0 (e.g. its pull-down section is on) before the active-to-sleep transition and the sleep period is sufficiently long, the steady-state value for the virtual ground voltage after entering sleep mode will be close to $V_{DD}$. A subcircuit typically includes at least tens of logic cells, and the probability of at least one of them having logic 0 at its output (before entering sleep mode) is close enough to one. Virtual ground of subcircuit $C_1$ will rise and nearly reach $V_{DD}$ after sufficient time spent in sleep mode.

Figure 2:
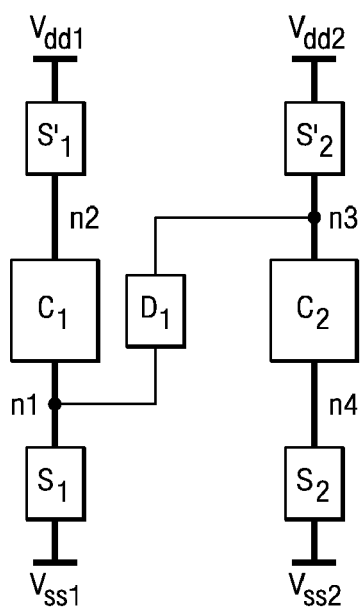
FIG. 2 illustrates another example CR configuration.

FIG. 2 illustrates an example CR configuration. In the CR configuration in FIG. 2, $V_{dd1}$ and $V_{dd2}$ may but need not be equal. Similarly, $V_{ss1}$ and $V_{ss2}$ may but need not be equal. $V_{ss1}$ may but need not be ground, and $V_{ss2}$ may but need not be ground. $S_1$ and $S'_2$ may each be a switch (e.g. a PMOS transistor, an NMOS transistor, or a transmission gate) or a switch in parallel with a clip circuit (e.g. a diode). $S_2$ and $S'_1$ may each be a switch (e.g. a PMOS transistor, an NMOS transistor, or a transmission gate), a switch in parallel with a clip circuit (e.g. a diode), or a wire. $D_1$ is a switch (e.g. a PMOS transistor, an NMOS transistor, or a transmission gate) or a switch in series with a clip circuit (e.g. a diode). $C_1$ and $C_2$ may but need not include memory elements.

In the CR configuration in FIG. 2, at least one of the following two conditions holds:

At the same time or shortly before or shortly after $C_1$ switches from sleep mode to active mode, $C_2$ switches from sleep mode to active mode; furthermore, when $C_1$ switches from sleep mode to active mode, the voltage at Node n1 is higher than the voltage at Node n3.

At the same time or shortly before or shortly after $C_2$ switches from active mode to sleep mode, $C_1$ switches from active mode to sleep mode; furthermore, when $C_2$ switches from active mode to sleep mode, the voltage at Node n3 is higher than the voltage at Node n1.

Particular embodiments perform CR in the configuration illustrated by FIG. 2 by turning on $D_1$ for a period of time shortly before both $C_1$ and $C_2$ enter active mode or by turning on $D_1$ for a period of time shortly after both $C_1$ and $C_2$ enter sleep mode. During CR, neither the output of $C_1$ nor the output of $C_2$ is used.

Figure 3:
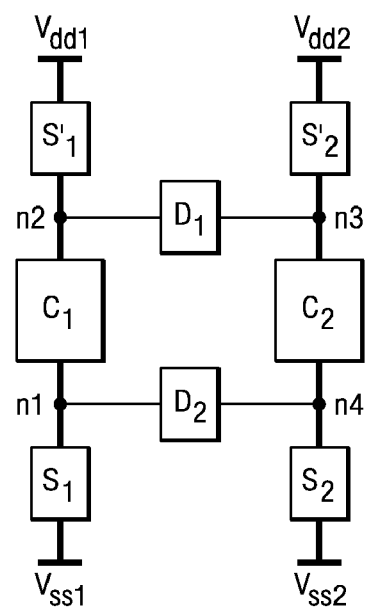
FIG. 3 illustrates another example CR configuration.

FIG. 3 illustrates another example CR configuration. In the CR configuration in FIG. 3, $V_{dd1}$ and $V_{dd2}$ may but need not be equal. Similarly, $V_{ss1}$ and $V_{ss2}$ may but need not be equal. $V_{ss1}$ may but need not be ground, and $V_{ss2}$ may but need not be ground. $S_1$ and $S'_1$ may each be a switch (e.g. a PMOS transistor, an NMOS transistor, or a transmission gate), a switch in parallel with a clip circuit (e.g. a diode), or a wire, but $S_1$ and $S'_1$ may not both be wires. $S_2$ and $S'_2$ may each be a switch (e.g. a PMOS transistor, an NMOS transistor, or a transmission gate), a switch in parallel with a clip circuit (e.g. a diode), or a wire, but $S_2$ and $S'_2$ may not both be wires. $D_1$ and $D_2$ are each a switch (e.g. a PMOS transistor, an NMOS transistor, or a transmission gate), a switch in series with a clip circuit (e.g. a diode), or an open circuit, but D1 and D2 may not both be open circuit. $C_1$ and $C_2$ may but need not include memory elements. If $D_1$ is not an open circuit, $S'_1$ and $S'_2$ are not short circuit. If $D_2$ is not an open circuit, $S_1$ and $S_2$ are not short circuit.

In the example CR configuration in FIG. 3, at least one of the following four conditions holds:

$D_1$ is not an open circuit and, at the same time or shortly before or shortly after $C_1$ switches from sleep mode to active mode, $C_2$ switches from active mode to sleep mode. When $C_1$ switches from sleep mode to active mode, the voltage at Node n3 is higher than the voltage at Node n2.

$D_1$ is not an open circuit and, at the same time or shortly before or shortly after $C_2$ switches from sleep mode to active mode, $C_1$ switches from active mode to sleep mode. When $C_2$ switches from sleep mode to active mode, the voltage at Node n2 is higher than the voltage at Node n3.

$D_2$ is not an open circuit and, at the same time or shortly before or shortly after $C_1$ switches from sleep mode to active mode, $C_2$ switches from active mode to sleep mode. When $C_1$ switches from sleep mode to active mode, the voltage at Node n1 is higher than the voltage at Node n4.

$D_2$ is not an open circuit and, at the same time or shortly before or shortly after $C_2$ switches from sleep mode to active mode, $C_1$ switches from active mode to sleep mode. When $C_2$ switches from sleep mode to active mode, the voltage at Node n4 is higher than the voltage at Node n1.

Figure 4:
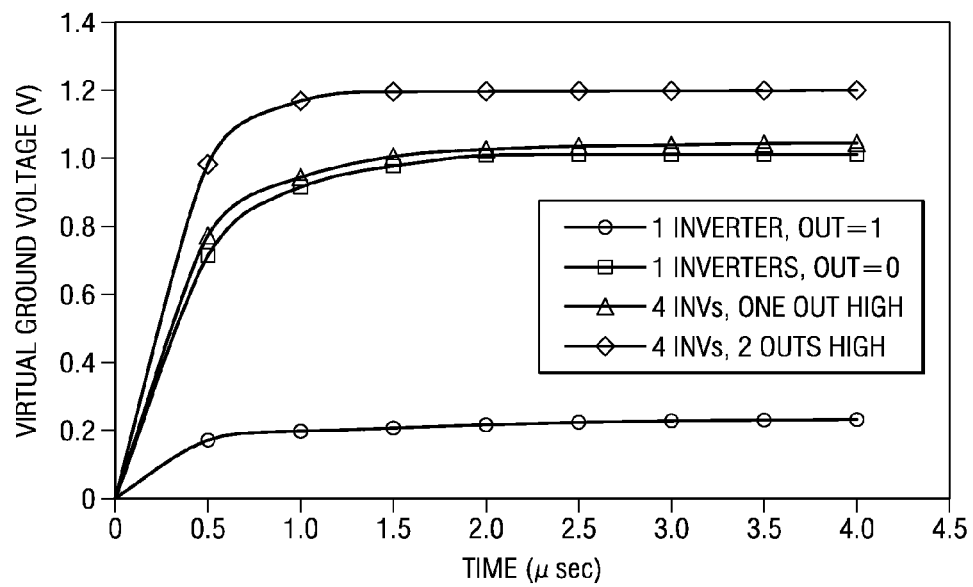
FIG. 4 illustrates example voltage waveforms of a virtual ground node in four different cases.

FIG. 4 illustrates example voltage waveforms of a virtual ground node in four different cases. Each case uses an n-type metal-oxide-semiconductor (NMOS) sleep transistor (the use of a p-type metal-oxide-semiconductor (PMOS) sleep transistor produces similar results, except the corresponding output states are reversed). In the first case, subcircuit $C_1$ includes a single inverter cell. The output of the inverter cell is forced to logic 1 before entering sleep mode. As FIG. 4 shows, after entering sleep mode, the virtual ground voltage of the inverter cell rises to approximately 200 mV, which is much less than $V_{DD}$ of 1.2 V. In the next case, the output of the inverter in the same subcircuit $C_1$ is forced to logic 0. The virtual ground voltage rises to approximately 0.95 V, which is close to $V_{DD}$ and a suitable level for CR. In the next two cases, $C_1$ includes four inverter cells, each connected to an input of $C_1$. In the first of these two cases, three of the inverter outputs are 1 and one inverter output is 0. The virtual ground voltage rises to even a higher level than the second case above, resulting in a final steady sate voltage level of approximately 1 V, which is again suitable for CR. In the last case, two inverter outputs are set to logic 1 and the others are set to logic 0. After entering sleep mode, the virtual ground node would rise and achieve a level even closer to $V_{DD}$. FIG. 4 confirms this: the top waveform shows the virtual ground of the subcircuit $C_1$ reaches a level of nearly 1.2 V. As long as a relatively large number of logic cells that use an NMOS sleep transistor are in a subcircuit, the probability that one of the cells will have a logic 0 output value before entering sleep mode is high (in fact probably close to one) so the virtual ground voltage of such a subcircuit will gradually rise and stabilize to a level near $V_{DD}$. This stabilization occurs after a relatively short period of sleep time (usually on the order of microseconds) which provides an opportunity for CR between this subcircuit and another one that uses a PMOS sleep transistor.

Figure 5:
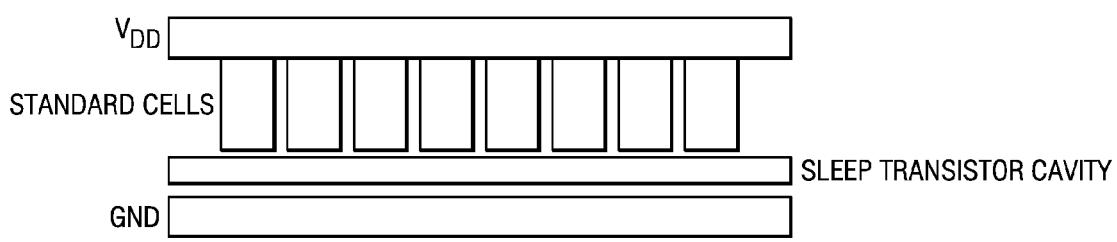
FIG. 5 illustrates an example cell row.

FIG. 5 illustrates an example cell row. Each cell row has a cavity for NMOS sleep transistors. The cavity holds all the sleep transistors for the row. FIG. 5 does not illustrate the virtual ground rail. Each cell row uses either one or more NMOS sleep transistors or one or more PMOS sleep transistors, but not both NMOS and PMOS. Moreover, cell rows alternate between NMOS and PMOS sleep transistor types, e.g., cells in Row 1 connect to virtual ground through an NMOS sleep transistor, cells in Row 2 connect to virtual $V_{DD}$ through a PMOS sleep transistor, and so on.

Figure 6:
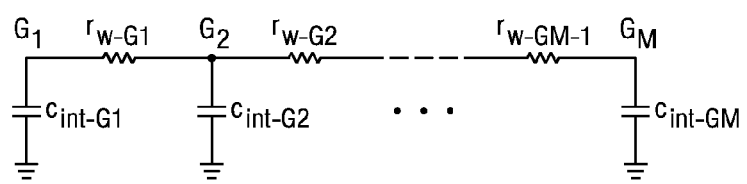
FIG. 6 illustrates an example virtual ground line model of a single cell row.

FIG. 6 illustrates an example virtual ground line model of a single cell row. $G_i$ denotes a connection node of the $i^{th}$ cell in the virtual ground line; $r_{w-Gi}$ denotes wiring resistance between $G_i$ and $G_{i+1}$; and $C_{int-Gi}$ represents interconnect capacitance at $G_i$. Particular embodiments may similar mode a virtual power line of a single row. Such embodiments may similarly define $P_i$, $r_{w-Pi}$, and $C_{int-Pi}$.

In the presence of RC parasitics associated with the virtual ground and virtual $V_{DD}$ lines, particular embodiments determine CR time (which particular embodiments define as a minimum time necessary for CR transistors to remain on for completion of at least $(1-\delta) \times 100$ percent of full CR) based on the sizes of the logic cells connected to the virtual ground and virtual $V_{DD}$ lines, the sizes of the CR transistors, and the connection points of the CR transistors to the virtual ground and virtual $V_{DD}$ lines. Where appropriate, particular embodiments assume that CR between each pair of nodes in the virtual ground and virtual $V_{DD}$ lines uses an NMOS pass transistor instead of a transmission gate. However, CR may use a transmission gate as well.

Figure 7:
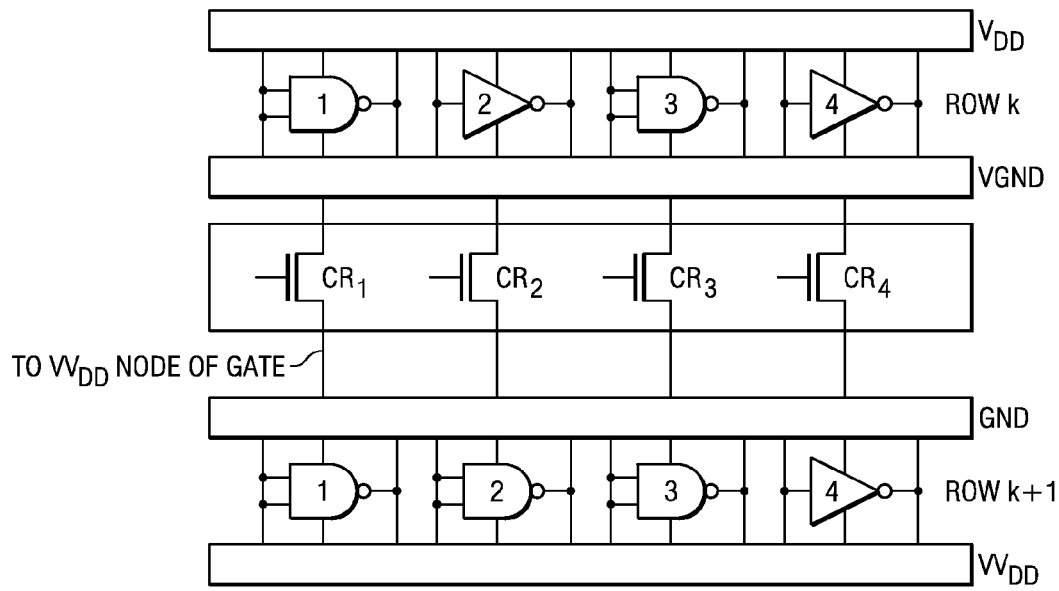
FIG. 7 illustrates an example application of CR between two consecutive rows by placing CR transistors between the two rows.

Consider CR between two rows with M cells per each row. If the two rows have different numbers of cells, particular embodiments set M to the smaller number. FIG. 7 illustrates an example application of CR between two consecutive rows by placing CR transistors between the two rows. In FIG. 7, each CR transistor, $CRT_i$, connects the virtual ground node of a cell in the upper row to the virtual $V_{DD}$ node of a cell in the lower row. For example, $CRT_1$ connects the virtual ground node of Cell 1 in row k to the virtual $V_{DD}$ node of Cell 1 in row k+1. To simplify optimization and to reduce routing complexity, particular embodiments allow only connections of the form $G_i$–$P_i$, which is a connection of the form $G_i$–$P_j$ where i≠j is not allowed. Due to space considerations, FIG. 7 does not illustrate connections between CR transistors and the virtual $V_{DD}$ line.

Figure 8:
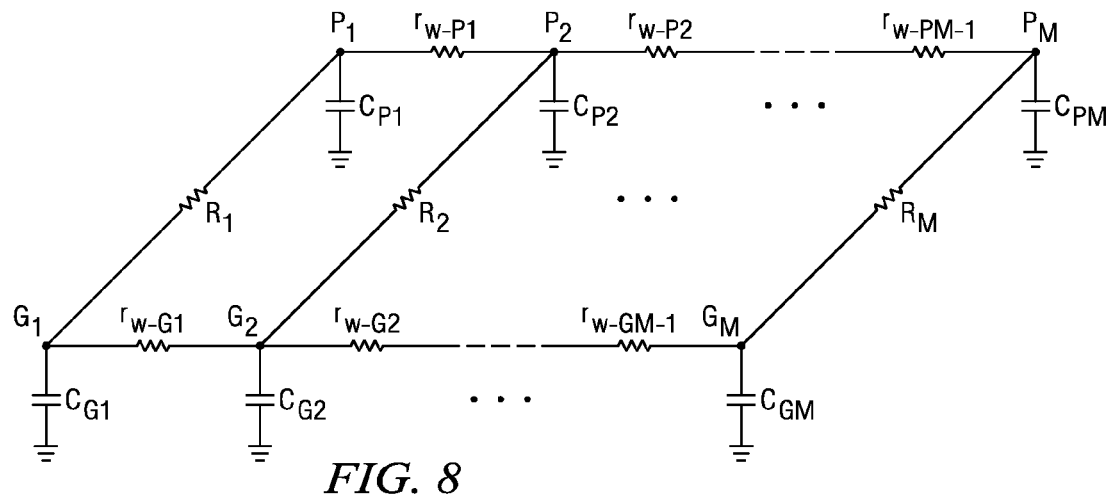
FIG. 8 illustrates an example circuit model for CR.

For modeling purposes, during CR, when the CR transistors are on, particular embodiments replace each CR transistor, $CRT_i$, with its resistive model, $R_i$, which connects node $G_i$ in the virtual ground line to its corresponding node, $P_i$, in the virtual $V_{DD}$ line, as FIG. 8 illustrates. In FIG. 8, the virtual ground and virtual $V_{DD}$ lines have been replaced by their equivalent RC interconnect models, as in FIG. 6. In the virtual $V_{DD}$ line, particular embodiments define $r_{w\text{-}P_i}$ and $c_{int\text{-}P_i}$ in the same manner as $r_{w\text{-}G_i}$ and $c_{int\text{-}G_i}$ in the virtual ground line. Particular embodiments define $C_{G_i}$ and $C_{P_i}$ in FIG. 8 as follows:

$$C_{G_i}=c_{int\text{-}G_i}+C_{d\text{-}G_i}$$

$$C_{P_i}=c_{int\text{-}P_i}+C_{d\text{-}P_i} \quad (1)$$

The terms $C_{d\text{-}G_i}$ and $C_{d\text{-}P_i}$ represent total diffusion capacitances of nodes $G_i$ and $P_i$, respectively. If a node directly connects to a sleep transistor, the diffusion term may also include diffusion capacitance of the sleep transistor. In sleep mode, all $C_{G_i}$ capacitances charge to approximately $V_{DD}$ and all $C_{P_i}$ capacitances discharge to approximately zero. In active mode, all $C_{P_i}$ capacitances charge to approximately $V_{DD}$ and all $C_{G_i}$ capacitances completely discharge. Before going from sleep mode to active mode, particular embodiments allow a portion of the charge of the virtual ground capacitances to migrate to the virtual $V_{DD}$ capacitances to reduce the overall energy consumption during mode transition. In particular embodiments, we should decide on the number, the connection points to the virtual rails, and the sizes of the CR transistors.

To decide the number, the connection points to the virtual rails, and the size of the CR transistors, particular embodiments formulate an optimization problem that maximizes total Energy Saving Ratio (ESR) for CR between two rows, subject to γ percent violation in wakeup delay in the original circuit, e.g., the wakeup delay of the circuit when CR is not used. Particular embodiments define the wakeup time in each case as the time needed for the slowest node in the virtual GND to reach the value $\delta \times V_{DD}$ during sleep-active transition. With this definition for wakeup time, particular embodiments express the set of constraints as follows:

$$t_{w_i}^{(CR)} \leq (1+\gamma) \times t_w \quad \forall 1 \leq i \leq M \quad (2)$$

The term $t_w$ represents the wakeup time of the row in the original circuit and the term $t_{w_i}^{(CR)}$ represents the wakeup time of the $i^{th}$ cell in the same row, e.g., the cell connected to the node $G_i$ in the virtual ground line. Particular embodiments express the term $t_{w_i}^{(CR)}$ as follows:

$$t_{w_i}^{(CR)}=d_i^{CR}+t_{rem_i} \quad \forall 1 \leq i \leq M \quad (3)$$

The term $d_i^{CR}$ represents the CR delay for node $G_i$ (which particular embodiments define as the time the voltage of the node $G_i$ takes to drop from $V_{DD}$ to within a percent of its final value, $\alpha \times V_{DD}$) and $t_{rem_i}$ represents the remaining time needed for $G_i$ to drop from $\alpha \times V_{DD}$ to zero by turning on one or more sleep transistors after CR completes. The value of α depends on the ratio of the total capacitance in the virtual ground and virtual $V_{DD}$ rails. For the case of equal total capacitance on the virtual rails, α=0.5. Using Equation 3, particular embodiments express the constraint set in Equation 2 as follows:

$$d_i^{CR} \leq (1+\gamma) \times t_w - t_{rem_i} \quad \forall 1 \leq i \leq M \quad (4)$$

By definition, $t_w$ is independent of location and size of the CR transistors. If we ignore diffusion capacitances of the CR transistors, $t_{rem_i}$ is also independent of the location and size of the CR transistors. For an already placed design with known sleep transistor sizing and placement information, particular embodiments use an Elmore delay model to calculate $t_w$ and $t_{rem_i}$ for each row.

Particular embodiments use this set of constraints to maximize the total ESR for adjacent standard cell rows, $ESR_{rows}$:

$$ESR_{row} = \frac{(E_{conv.} - E_{cr}) - E_{cr\text{-}overhead}}{E_{conv.}} = ESR - \frac{E_{crt\text{-}overhead}}{E_{conv.}} \quad (5)$$

The term $E_{cr\text{-}overhead}$ represents total dynamic and leakage energy consumption in CR transistors for a complete sleep-active-sleep cycle. The first term in Equation 5, ESR, depends on the total capacitance ratio in the virtual ground and virtual $V_{DD}$ lines, but not the CR circuitry. Therefore, in particular embodiments the problem of maximizing $ES_{row}$ is equivalent to the problem of minimizing $E_{cr\text{-}overhead}$ or equivalently minimizing power overhead due to CR transistors. Particular embodiments express the total power overhead in each row as the sum of dynamic and leakage power consumption due to CR transistors:

$$P_{cr\text{-}overhead} = \sum_{i=1}^{M} C_{g_i} f V_{DD}^2 + \sum_{i=1}^{M} I_{leak_i} V_{DD} \quad (6)$$

The first and second summation terms represent total dynamic and leakage power consumption due to the CR transistors in the row under consideration. The term f represents the mode transition frequency, the term $C_{g_i}$ represents the input gate capacitance for the $i^{th}$ CR transistor in the row, and the term $I_{leak_i}$ represents the subthreshold leakage current of the $i^{th}$ CR transistor. Particular embodiments estimate the gate capacitance of the $i^{th}$ CR transistor, $C_{g_i}$, as follows:

$$C_{g_i}=C_{ox}W_iL \quad (7)$$

The term $W_i$ represents the width of the $i^{th}$ CR transistor. Particular embodiments express the subthreshold leakage current of the $i^{th}$ CR transistor, $I_{leak_i}$, as follows:

$$I_{leak_i} = \mu_0 \frac{\varepsilon_{ox}}{T_{ox}} \frac{W_i}{L} v_T^2 e^{1.8} \exp\left(\frac{V_{gs} - V_{th}}{Sv_T}\right)\left(1 - \exp\left(-\frac{V_{ds}}{v_T}\right)\right) \quad (8)$$

The terms $V_{gs}$ and $V_{ds}$ represent the gate-source and drain-source voltages of the CR transistor, respectively. The leakage current may be significant during sleep mode when the CR transistor is off and $V_{gs}=0$. Here, $V_{ds}$ for each CR transistor represents the absolute voltage difference between the virtual ground and virtual $V_{DD}$ lines at the connection nodes of the CR transistor. From Equation 8, particular embodiments ignore dependence of the subthreshold leakage current of the CR transistor on $V_{ds}$ when $V_{ds} \geq 75$ mV. In a typical MTCMOS circuit, $V_{ds}$ is usually greater than or equal to 75 mV soon after mode transition. Hence, particular embodiments ignore dependence of the leakage current of a CR transistor on its drain-source voltage. Thus, particular embodiments treat the total leakage current of a CR transistor as proportional to its width.

From Equations 7 and 8, particular embodiments express the total power overhead in Equation 6 as a linear function of the widths of CR transistors:

$$P_{cr-overhead} = A \sum_{i=1}^{M} W_i \quad (9)$$

Particular embodiments define the term A as follows:

$$A = LC_{ox}fV_{DD}^2 + \frac{\mu_0 \varepsilon_{ox}}{LT_{ox}} V_{DD} v_T^2 e^{1.8} \exp\left(\frac{-V_{th}}{Sv_T}\right) \quad (10)$$

Therefore, in particular embodiments, minimizing power overhead is equivalent to minimizing total CR transistor width.

Next, consider the timing constraints in Equation 2. Equation 2 includes M separate timing constraints, one for each $G_i$ node in the virtual ground line. All nodes in the virtual ground line charge to approximately $V_{DD}$ in sleep mode. They remain charged to approximately $V_{DD}$ until the end of sleep mode and before the beginning of the CR operation. Satisfying the constraints in Equation 2 indicates that a maximum increase in discharge time for all nodes in virtual ground is less than γ percent of the wakeup time for the original circuit. Consider discharging node $G_i$ in FIG. 8. In FIG. 8, each CR transistor is replaced by its equivalent resistive model in a linear region. Particular embodiments express the value of the equivalent resistance as follows:

$$R_i = \frac{\eta}{W_i} \quad (11)$$

Particular embodiments define the term η as follows:

$$\eta = \frac{L}{\mu C_{ox}(V_{DD} - V_{th})} \quad (12)$$

The term L represents the length of the CR transistor.

In FIG. 8, M different resistors contribute to the CR operation. These resistors provide discharge paths between virtual ground and virtual $V_{DD}$. To simplify the discharge scenario for each node $G_i$ in the virtual ground, a single equivalent resistor, $R_{eq_i}$, between $G_i$ and $P_i$ may replace $R_i$ resistors for all values of i. Since there are M nodes in the row, there will be M equivalent resistors, $R_{eq_1}$–$R_{eq_M}$, one for each node representing a discharging scenario. Particular embodiments define the term $R_{eq_i}$ as follows:

$$R_{eq_i} = \frac{\gamma}{W_{eq_i}} = \frac{\gamma}{\sum_{j=1}^{M}(1 - \alpha|x_i - x_j|W_j)} \quad 1 \leq i, j \leq M \quad (13)$$

The term $W_{eq_i}$ represents the equivalent NMOS transistor width with $R_{eq_i}$ linear-region resistance, $x_i$ and $x_j$ represent the x coordinates of nodes $G_i$ and $G_j$ in the virtual ground line, and α is a user-defined coefficient, which depends on the charge-recycling resistances between different $G_i$ and $P_i$ nodes, resistances $R_i$, and the interconnect resistance per unit length for the virtual GND line.

Particular embodiments define the term $W_{eq_i}$ in Equation 13 as a weighted average of the widths of all CR transistors, with weights for the different CR transistors being defined according to their distances from the cell under consideration. Terms $R_{eq_i}$ and $W_{eq_i}$ are related to each other through Equation 11. From Equation 13, particular embodiments express the term $W_{eq_i}$ as follows:

$$W_{eq_i} = \sum_{j=1}^{M} b_{ij} W_j \quad \forall i \; 1 \leq i \leq M \quad (14)$$

Particular embodiments define the coefficients $b_{ij}$ as follows:

$$b_{ij} = 1 - \alpha|x_i - x_j| \quad 1 \leq i,j \leq M \quad (15)$$

Equation 14 provides a value for each $W_{eq_i}$ as a linear function of all $W_i$.

Figure 9:
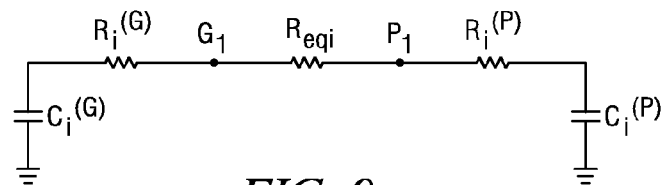
FIG. 9 illustrates an example circuit model replacing RC interconnect networks in virtual ground and virtual $V_{DD}$ lines with equivalent RC-lumped models.

Particular embodiments further simplify the circuit by replacing the RC interconnect networks in the virtual ground and virtual $V_{DD}$ lines with their equivalent RC-lumped models at nodes $G_i$ and $P_i$, respectively. FIG. 9 illustrates an example model of this type. Particular embodiments calculate the RC-lumped model elements for virtual ground, $R_i^{(G)}$ and $C_i^{(G)}$, as follows:

$$C_i^{(G)} = Y_{G,1i} \quad (16)$$

$$R_i^{(G)} = -\frac{Y_{G,2i}}{Y_{G,1i}^2}$$

The terms $Y_{G,1i}$ and $Y_{G,2i}$ represent the first and second moments of total admittance at node $G_i$ in the virtual ground RC tree and particular embodiments calculate these terms from the Taylor series expansion of the total admittance at node $G_i$, $Y_{G_i}(s)$, e.g.:

$$Y_{G_i}(s) = Y_{G,1i}s + Y_{G,2i}s^2 + \ldots + Y_{G,ki}s^k + \ldots \quad (17)$$

Particular embodiments similarly calculate the elements of the RC-lumped model of the virtual $V_{DD}$ line.

Particular embodiments recursively calculate the first and second moments of total admittance at any node in the virtual ground or virtual $V_{DD}$ lines in an RC tree.

Particular embodiments define the CR delay in the example circuit that FIG. 9 illustrates as the time the voltage at node $G_i$ takes to drop from $V_{DD}$ to $\delta$ percent of its final value. Particular embodiments may calculate the CR delay for node $G_i$ may be as follows:

$$d_i^{CR} = \frac{1}{\ln(\delta)} \times \frac{(R_i^{(G)} + R_{eq_i} + R_i^{(P)})C_i^{(G)}C_i^{(G)}}{(C_i^{(G)} + C_i^{(P)})} \quad (18)$$

Using Equations 13, 14, and 18, particular embodiments express the set of constraints in Equation 4 as follows:

$$\sum_{j=1}^{M} b_{ij}W_j \geq W_{min-i} \quad \forall i \; 1 \leq i \leq M \quad (19)$$

The term $W_{min-i}$ represents a lower bound on $W_{eq_i}$, and particular embodiments calculate this term as follows:

$$W_{min-i} = \eta \left[ [(1+\gamma)t_w - t_{rem_i}]\ln(\delta) \times \frac{(C_i^{(G)} + C_i^{(P)})}{C_i^{(G)}C_i^{(P)}} - R_i^{(G)} - R_i^{(P)} \right]^{-1} \quad (20)$$

Having defined the set of linear constraints in Equation 19 and having as an objective a minimization of total power overhead in Equation 9, particular embodiments formulate and solve the optimization problem using one or more standard mathematical programming packages as follows:

$$\text{Minimize}\left(\sum_{i=1}^{M} W_i\right) \quad (21)$$

$$\text{s.t.:} \sum_{j=1}^{M} b_{ij}W_j \geq W_{i-min} \quad \forall i \; 1 \leq i \leq M$$

$$W_i \geq 0 \quad \forall i \; 1 \leq i \leq M$$

The optimization problem defined by Equation 21 is an LP problem, which is a polynomial time solvable problem.

Particular embodiments use only one sleep transistor for each cell row. Particular embodiments fix placement of the sleep transistors and reserve the left-most corner of each cell row for sleep-transistor placement. Particular embodiments then size the sleep transistor for each row be sized for a maximum delay penalty of approximately 10%. After sleep transistor sizing and placement, particular embodiments extract the resulting gate-level netlist as well as the virtual ground and virtual $V_{DD}$ interconnect values and use this information to calculate $b_{ij}$ values in Equation 15 and $W_{min-i}$ values in Equation 20.

Particular embodiments pass calculated $b_{ij}$ and $W_{min-i}$ values to an LP solver for solution of the optimization problem in Equation 21. In particular embodiments, a hardware, software, or embedded logic component or a combination of two or more such components for solving LP problems solves the optimization problem in Equation 21, according to particular needs. As an example and not by way of limitation, particular embodiments use a suitable version of MATLAB to solve the LP problem in Equation 21. One or more computer systems may, in particular embodiments, include the hardware, software, or embedded logic component or a combination of two or more such components used to solve the optimization problem in Equation 21. Knowing the total virtual rail capacitance value for each row and the total required CR transistor width for every pair of rows, particular embodiments calculate the total energy overhead in Equation 5.

Active/sleep durations may affect total ESR achieved by CR MTCMOS. As an example and not by way of limitation, for CR to provide a maximum ESR, the sleep period of the circuit should be long enough to allow virtual ground and virtual $V_{DD}$ lines to finish their full voltage transitions before the edge of the CR operation in the sleep period. On the other hand, if the sleep period is too long, the overhead associated with CR will increase because of the additional leakage path created by the CR transistors. Particular embodiments look for a range of appropriate values for active duration and sleep duration. CR provides advantageous results for an acceptable range of active/sleep durations. To find appropriate ranges for active/sleep durations, active-mode duration was fixed and the amount of saving achieved for different sleep mode duration values was found.

Figure 10:
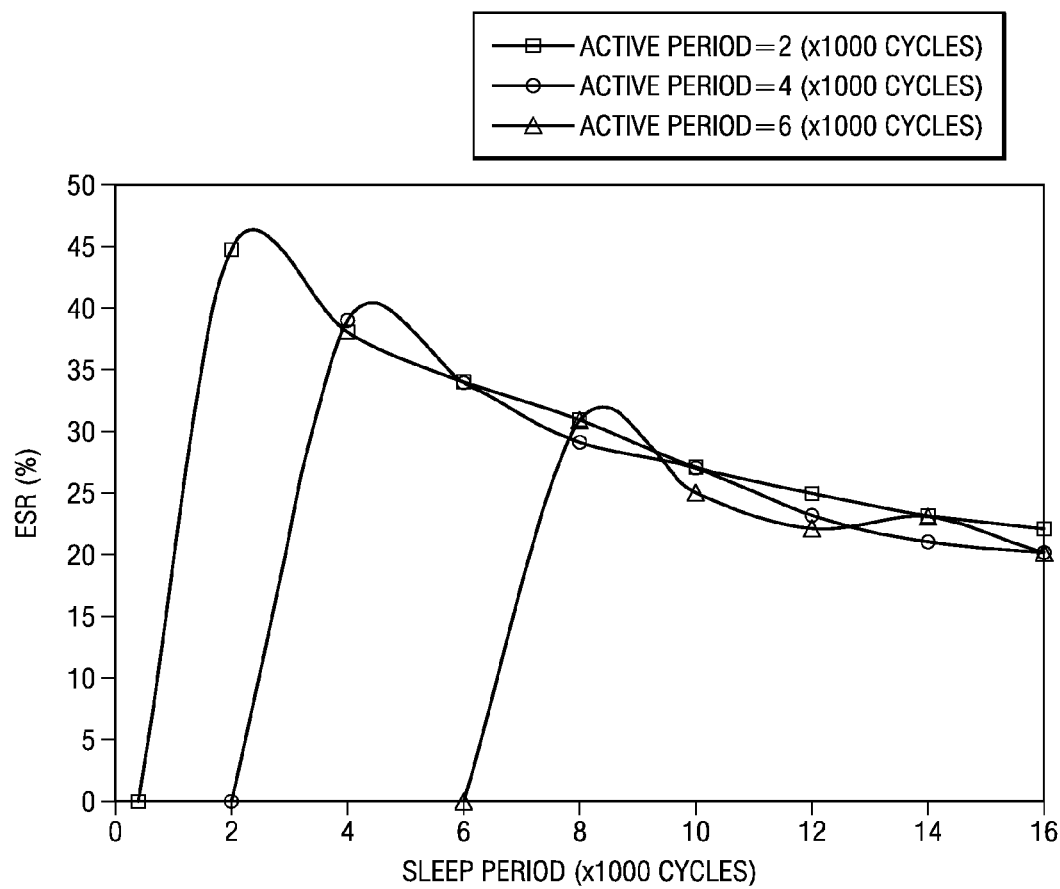
FIG. 10 illustrates example results of HSPICE simulations for an example chain of inverters.

FIG. 10 illustrates example results of HSPICE simulations for a chain of inverters in 90-nanometer technology. Each curve represents a fixed active duration. The results illustrated by FIG. 10 indicate that, for a given active duration, an optimum sleep duration value results in a maximum ESR. The results illustrated by FIG. 10 also show that total ESR decreases with an increase in sleep duration. This decrease in total ESR is a result of total saving staying fixed while total leakage overhead increases. Since the CR transistors have high threshold voltages, leakage overhead is low, which results in high ESR values, such as for example approximately 20%, even for long sleep durations.

Particular embodiments address and solve placement and sizing problems for CR MTCMOS circuits in the presence of RC interconnects. Particular embodiments formulate sizing and placement of CR transistors in a CR MTCMOS circuit as a linear programming (LP) problem. Particular embodiments use standard mathematical programming packages to solve sizing and placement of CR transistors in CR MTCMOS circuits. Particular embodiments more efficiently solve sizing and placement of CR transistors in CR MTCMOS circuits. Particular embodiments facilitate a reduction of energy consumption due to mode transition.

The present disclosure encompasses all changes, substitutions, variations, alterations, and modifications to the example embodiments described herein that a person having ordinary skill in the art would comprehend. Similarly, where appropriate, the appended claims encompass all changes, substitutions, variations, alterations, and modifications to the example embodiments described herein that a person having ordinary skill in the art would comprehend.

What is claimed is:

1. A circuit comprising:
a first row of first circuit blocks that are each connected to a supply directly and to ground via a first sleep transistor, a connection between the first circuit block and the first sleep transistor comprising a virtual ground node, the first sleep transistors all being n-channel metal-oxide-semiconductor (NMOS) transistors or all being p-channel metal-oxide-semiconductor (PMOS) transistors;
a second row of second circuit blocks that are each connected to ground directly and to the supply via a second sleep transistor, a connection between the second circuit block and the second sleep transistor comprising a virtual supply node, the second sleep transistors all being PMOS transistors if the first sleep transistors are NMOS transistors or all being NMOS transistors if the first sleep transistors are PMOS transistors, the first and second rows being consecutive; and a transmission gate (TG) or a pass transistor connecting each of one or more of the virtual ground nodes to each of one or more of the virtual supply nodes to enable charge recycling between first circuit blocks in the first row and second circuit blocks in the second row during transitions by the circuit from active mode to sleep mode, from sleep mode to active mode, or both.

2. The circuit of claim 1, comprising a configuration of a plurality of first rows and a plurality of second rows, the first rows alternating consecutively with the second rows in the configuration.

3. The circuit of claim 1, wherein the TG comprises an NMOS transistor and a PMOS transistor, a source of the NMOS transistor being connected to a drain of the PMOS transistor, a drain of the NMOS transistor being connected to a source of the PMOS transistor.

4. The circuit of claim 1, wherein a size of the TG or the pass transistor maintains or reduces a wake-up time of the circuit.

5. The circuit of claim 1, wherein placement and sizing of the TG or pass transistor takes into account a wake-up delay, energy consumption due to mode transition, or both.

6. The circuit of claim 1, wherein placement and sizing of the TG or pass transistor takes into account ground bounce (GB) during transitions by the circuit from sleep mode to active mode.

7. The circuit of claim 1, comprising a plurality of TGs or pass transistors.

8. A method comprising:
switching a circuit from sleep mode to active mode, the circuit comprising:
a first row of first circuit blocks that are each connected to a supply directly and to ground via a first sleep transistor, a connection between the first circuit block and the first sleep transistor comprising a virtual ground node, the first sleep transistors all being n-channel metal-oxide-semiconductor (NMOS) transistors or all being p-channel metal-oxide-semiconductor (PMOS) transistors;
a second row of second circuit blocks that are each connected to ground directly and to the supply via a second sleep transistor, a connection between the second circuit block and the second sleep transistor comprising a virtual supply node, the second sleep transistors all being PMOS transistors if the first sleep transistors are NMOS transistors or all being NMOS transistors if the first sleep transistors are PMOS transistors, the first and second rows being consecutive; and
a transmission gate (TG) or a pass transistor connecting each of one or more of the virtual ground nodes to each of one or more of the virtual supply nodes to enable charge recycling between first circuit blocks in the first row and second circuit blocks in the second row during transitions by the circuit from active mode to sleep mode, from sleep mode to active mode, or both;
the switch from sleep mode to active mode comprising:
turning on the TG or the pass transistor;
turning off the TG of the pass transistor after a predetermined period of time has lapsed; and
turning on the first and second sleep transistors after turning off the TG or the pass transistor; and
switching the circuit from active mode to sleep mode, the switch from active mode to sleep mode comprising:
turning off the first and second sleep transistors;
turning on the TG or the pass transistor after turning off the transistors; and
turning off the TG or the pass transistor after a predetermined period of time has lapsed.

9. The method of claim 8, wherein the circuit comprises a configuration of a plurality of first rows and a plurality of second rows, the first rows alternating consecutively with the second rows in the configuration.

10. The method of claim 8, wherein the TG comprises an NMOS transistor and a PMOS transistor, a source of the NMOS transistor being connected to a drain of the PMOS transistor, a drain of the NMOS transistor being connected to a source of the PMOS transistor.

11. The method of claim 8, wherein a size of the TG or the pass transistor maintains or reduces a wake-up time of the circuit.

12. The method of claim 8, wherein placement and sizing of the TG or pass transistor takes into account a wake-up delay, energy consumption due to mode transition, or both.

13. The method of claim 8, wherein placement and sizing of the TG or pass transistor takes into account ground bounce (GB) during transitions by the circuit from sleep mode to active mode.

14. The method of claim 8, wherein the circuit comprises a plurality of TGs or pass transistors.

15. A method comprising:
formulating one or more optimization problems for a circuit comprising at least two rows of circuit blocks having between them at least one transmission gate (TG) or pass transistor enabling charge recycling between the rows of circuit blocks, the optimization problems maximizing a total energy saving ratio (ESR) for charge recycling between the rows subject to a predetermined violation in wakeup delay without charge recycling, the optimization problems comprising one or more linear constraints corresponding to one or more of, wakeup time for the circuit with charge recycling, wakeup time for the circuit without charge recycling, a width of each of one or more TGs or pass transistors in the circuit, or a length of each of one or more TGs or pass transistors in the circuit; and
solving the one or more optimization problems with a linear programming algorithm.

16. The method of claim 15, wherein:
at least one of the rows is a first row of first circuit blocks that are each connected to a supply directly and to ground via a first sleep transistor, a connection between the first circuit block and the first sleep transistor comprising a virtual ground node, the first sleep transistors all being n-channel metal-oxide-semiconductor (NMOS) transistors or all being p-channel metal-oxide-semiconductor (PMOS) transistors;
at least one of the rows is a second row of second circuit blocks that are each connected to ground directly and to the supply via a second sleep transistor, a connection between the second circuit block and the second sleep transistor comprising a virtual supply node, the second sleep transistors all being PMOS transistors if the first sleep transistors are NMOS transistors or all being NMOS transistors if the first sleep transistors are PMOS transistors, the first and second rows being consecutive; and the TG or pass transistor connects each of one or more of the virtual ground nodes to each of one or more of the virtual supply nodes to enable charge recycling between first circuit blocks in the first row and second circuit blocks in the second row during transitions by the circuit from active mode to sleep mode, from sleep mode to active mode, or both.

17. The method of claim 16, wherein the circuit comprises a configuration of a plurality of first rows and a plurality of second rows, the first rows alternating consecutively with the second rows in the configuration.

18. The method of claim 15, wherein the TG comprises an NMOS transistor and a PMOS transistor, a source of the NMOS transistor being connected to a drain of the PMOS transistor, a drain of the NMOS transistor being connected to a source of the PMOS transistor.

19. The method of claim 15, wherein the circuit comprises a plurality of TGs or pass transistors.

20. Software embodied in one or more tangible computer-readable media and when executed operable to:

formulate one or more optimization problems for a circuit comprising at least two rows of circuit blocks having between them at least one transmission gate (TG) or pass transistor enabling charge recycling between the rows of circuit blocks, the optimization problems maximizing a total energy saving ratio (ESR) for charge recycling between the rows subject to a predetermined violation in wakeup delay without charge recycling, the optimization problems comprising one or more linear constraints corresponding to one or more of, wakeup time for the circuit with charge recycling, wakeup time for the circuit without charge recycling, a width of each of one or more TGs or pass transistors in the circuit, or a length of each of one or more TGs or pass transistors in the circuit; and solve the one or more optimization problems with a linear programming algorithm.

21. The software of claim 20, wherein:

at least one of the rows is a first row of first circuit blocks that are each connected to a supply directly and to ground via a first sleep transistor, a connection between the first circuit block and the first sleep transistor comprising a virtual ground node, the first sleep transistors all being n-channel metal-oxide-semiconductor (NMOS) transistors or all being p-channel metal-oxide-semiconductor (PMOS) transistors;

at least one of the rows is a second row of second circuit blocks that are each connected to ground directly and to the supply via a second sleep transistor, a connection between the second circuit block and the second sleep transistor comprising a virtual supply node, the second sleep transistors all being PMOS transistors if the first sleep transistors are NMOS transistors or all being NMOS transistors if the first sleep transistors are PMOS transistors, the first and second rows being consecutive; and the TG or pass transistor connects each of one or more of the virtual ground nodes to each of one or more of the virtual supply nodes to enable charge recycling between first circuit blocks in the first row and second circuit blocks in the second row during transitions by the circuit from active mode to sleep mode, from sleep mode to active mode, or both.

22. The software of claim 21, wherein the circuit comprises a configuration of a plurality of first rows and a plurality of second rows, the first rows alternating consecutively with the second rows in the configuration.

23. The software of claim 20, wherein the TG comprises an NMOS transistor and a PMOS transistor, a source of the NMOS transistor being connected to a drain of the PMOS transistor, a drain of the NMOS transistor being connected to a source of the PMOS transistor.

24. The software of claim 20, wherein the circuit comprises a plurality of TGs or pass transistors.

* * * * *